(12) United States Patent
Sandhu

(10) Patent No.: US 6,701,066 B2
(45) Date of Patent: Mar. 2, 2004

(54) DELIVERY OF SOLID CHEMICAL PRECURSORS

(75) Inventor: Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 341 days.

(21) Appl. No.: 09/976,176

(22) Filed: Oct. 11, 2001

(65) Prior Publication Data

US 2003/0072875 A1 Apr. 17, 2003

(51) Int. Cl.[7] ............................................. A01G 13/06
(52) U.S. Cl. ...................................... 392/386; 392/398
(58) Field of Search ................................. 392/386, 387, 392/388, 389, 394, 396, 398; 118/715, 726, 727; 427/592, 587, 248.01

(56) References Cited

U.S. PATENT DOCUMENTS

| | | | |
|---|---|---|---|
| 4,220,460 A | * 9/1980 | Partus | ........................ 65/530 |
| 4,276,243 A | * 6/1981 | Partus | ........................ 261/128 |
| 5,322,710 A | * 6/1994 | Visser | ..................... 427/248.1 |
| 5,562,776 A | 10/1996 | Sapru et al. | |
| 5,674,574 A | 10/1997 | Atwell et al. | |
| 5,702,532 A | 12/1997 | Wen et al. | |
| 5,764,849 A | * 6/1998 | Atwell | ........................ 392/386 |
| 5,820,922 A | 10/1998 | Ricco et al. | |
| 5,832,177 A | * 11/1998 | Shinagawa et al. | ......... 392/394 |
| 5,868,159 A | 2/1999 | Loan et al. | |
| 5,876,503 A | 3/1999 | Roeder et al. | |
| 5,945,162 A | 8/1999 | Senateur et al. | |
| 5,966,499 A | * 10/1999 | Hinkle et al. | ................ 392/388 |
| 6,072,939 A | 6/2000 | Atwell | |
| 6,086,952 A | 7/2000 | Lang et al. | |
| 6,110,531 A | 8/2000 | Paz de Araujo et al. | |
| 6,136,725 A | 10/2000 | Loan et al. | |
| 6,161,398 A | * 12/2000 | Partus | ........................ 65/379 |
| 6,185,370 B1 | * 2/2001 | Sekimoto et al. | ........... 392/386 |
| 6,225,007 B1 | 5/2001 | Horne et al. | |
| 6,242,771 B1 | 6/2001 | Hsu et al. | |
| 6,271,498 B1 | * 8/2001 | Miyake et al. | ......... 219/121.43 |

* cited by examiner

Primary Examiner—Edward K. Look
Assistant Examiner—Vinod D. Patel
(74) Attorney, Agent, or Firm—Dinsmore & Shohl LLP

(57) ABSTRACT

Systems and methods are provided for delivering solid precursors in deposition processes. A flow monitor is used to measure and regulate the flow of vaporized solid precursor material from a vaporization chamber to a deposition chamber. The flow monitor chokes the supply of vapor into deposition chamber to regulate vapor flow. To avoid condensation of the solid precursor material in the delivery lines or flow monitor, a controller is placed in a feed back loop to monitor the flow rate make adjustments to the amount of vapor available at the inlet of the flow monitor.

58 Claims, 8 Drawing Sheets

DELIVERY OF SOLID CHEMICAL PRECURSORS

BACKGROUND OF THE INVENTION

The present invention relates in general to vapor delivery systems for deposition processes, and in particular to systems and methods for reliably delivering solid precursors to a deposition chamber.

Chemical vapor deposition (CVD) is a common process used in the manufacturing of films, coatings, and semiconductor devices. In a CVD process, a layer is formed on a substrate such as a semiconductor wafer by the reaction of vapor phase chemicals on or near the surface of the substrate. CVD processing is highly desirable in many applications due to it's relatively fast processing times and ability to form highly conformal layers on irregular shaped surfaces including deep contact openings.

CVD processes typically deliver one or more gaseous reactants to the surface of substrates positioned within a deposition chamber under temperature and pressure conditions favorable to the desired chemical reactions. As such, the types of layers that can be formed on a substrate using CVD techniques is limited by the types of reactants or precursors that can be delivered to the surface of the substrate.

Liquid precursors are commonly used in CVD processes due to the ease of their delivery to the deposition chamber. In typical liquid precursor systems, the liquid precursor is placed in a bubbler and heated sufficiently to transform the precursor to the vapor phase. A carrier gas typically either travels through the liquid precursor or passes over the bubbler at a controlled rate thus saturating the carrier gas with the precursor. The carrier gas then carries the liquid precursor to the surface of the substrate. Liquid precursors are commonly employed in CVD processes because the amount of liquid precursor can be precisely and consistently controlled.

The techniques developed for the delivery of liquid precursors cannot be used to reliably deliver solid precursors however. It is difficult to vaporize a solid precursor at a controlled rate such that reproducible flows are achieved. As a solid precursor sublimates, the shape and morphology of the remaining solid precursor changes. The changing volume of the solid precursor results in a continuously changing rate of vaporization. The changing rate of vaporization is notable particularly in thermally sensitive compounds. Additionally, an oversupply of vaporized solid precursor can result in condensation of the vapor back into a solid thus clogging vapor delivery lines and other monitoring equipment. Further, the use of a carrier gas is substantially ineffective as a means to implement rapid changes to the flow of the solid precursors.

Despite the difficulties in delivering solid precursors in CVD processes, there are many desirable precursor materials including for example, organometallic precursors, that are readily available in solid form. Further, many desirable precursor materials including organic and inorganic precursor materials may not be readily available in gas or liquid form. Also, solid precursors are particularly useful in the deposition of metal-based films, such as metal nitrides and metal silicides.

Therefore, there is a need in the art for a vapor delivery system for delivering solid precursors in a CVD process at a controllable rate.

SUMMARY OF THE INVENTION

This need is met by the present invention wherein systems and methods are provided for delivering solid precursors in deposition processes. A flow monitor is used to measure the flow of vaporized solid precursor material. The flow monitor is capable of measuring vapor flow that is maintained at a high temperature and low inlet and outlet pressure to avoid condensation of the precursor. The vapor flow measured by the flow monitor is fed back to a controller arranged to adjust the supply of vapor at the inlet of the flow monitor.

In accordance with one embodiment of the present invention, a solid precursor material is sublimated in a vaporization chamber by heating the solid precursor material with a fast response heater. As the vaporized solid precursor material is fed from the vaporization chamber into a deposition chamber, a flow monitor measures the vapor flow. The vapor flow measurements are input into a controller that communicates with the fast response heater to effect rapid changes to the temperature applied to the solid precursor material. As such, the temperature changes affect the rate at which the solid precursor sublimates, and thus the vapor flow is controlled.

In accordance with another embodiment of the present invention, a solid precursor material is sublimated in a vaporization chamber and fed into a deposition chamber. As the vaporized solid precursor material is fed into the deposition chamber, a flow monitor measures the vapor flow. The vapor flow measurements are input into a controller that communicates with a valve positioned upstream of the flow monitor to adjust the amount of excess vapor siphoned by the valve, and thus the vapor flow is controlled.

In accordance with another embodiment of the present invention, a solid precursor material is sublimated in a vaporization chamber by heating the solid precursor material with a fast response heater. As the vaporized solid precursor material is fed from the vaporization chamber into a deposition chamber, a flow monitor measures the vapor flow. The vapor flow measurements are input into a controller that communicates with the fast response heater to effect rapid changes to the temperature applied to the solid precursor material and/or the controller communicates with a valve positioned upstream of the flow monitor to adjust the amount of excess vapor siphoned by the valve, and thus the vapor flow is controlled.

Accordingly, it is an object of the present invention to provide systems and methods of delivering a solid precursor to a deposition process.

It is an object of the present invention to provide systems and methods to reliably measure the vapor flow of a solid precursor.

It is an object of the present invention to provide systems and methods to reliably and rapidly change the flow of vapor supplied to a deposition process.

Other objects of the present invention will be apparent in light of the description of the invention embodied herein.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals, and in which.

DETAILED DESCRIPTION OF THE PREFERRED EMBODIMENTS

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

Figure 1:
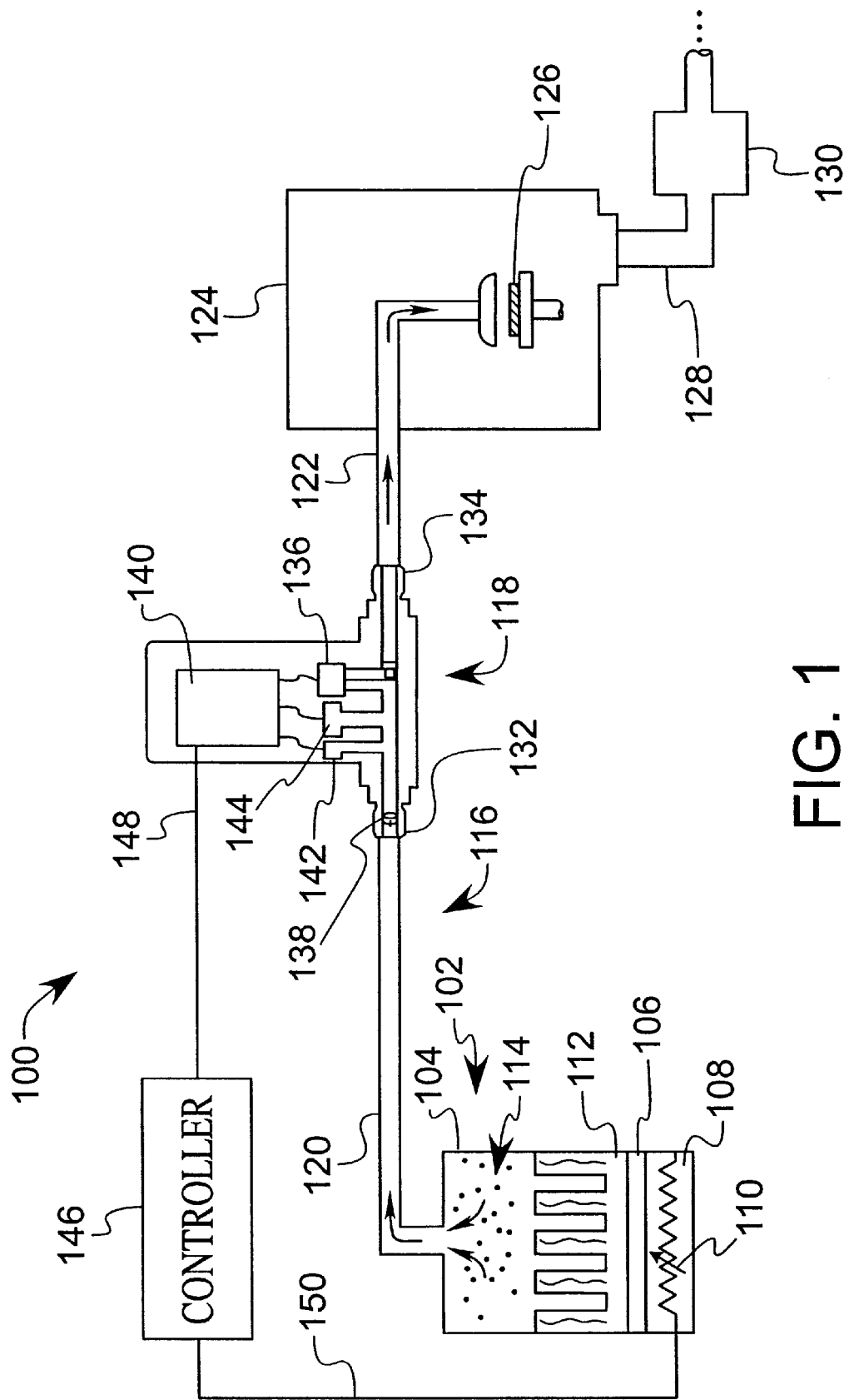
FIG. 1 is a schematic illustration of a vapor delivery system for a deposition process according to one embodiment of the present invention.

Referring to FIG. 1, a vapor delivery system 100 for the controlled delivery of solid precursors is illustrated. A vaporization chamber 102 includes a housing 104 and a first surface 106 that is coupled to a heating device 108. The heating device 108 regulates the temperature of the first surface 106 and includes a variable temperature control 110 to adjust the temperature that the heating device 108 supplies to the first surface 106. The temperature control 110 is arranged to vary the temperature of the heating device 108 over a range of temperatures as more fully explained herein.

During deposition processing, a solid precursor material 112 is positioned on the first surface 106 of the vaporization chamber 102, and the heating device 108 heats the first surface 106 to a temperature sufficient to transform the solid precursor material 112 to a vapor 114. As such, at least a portion of the temperatures within the range of temperatures controllable by the temperature control 110 are sufficient to sublimate or otherwise transform the solid precursor material 112 to a vapor 114.

The heating device 108 does not need to be in direct contact with the first surface 106. Rather, it will be understood that any coupling can be used to transfer the energy generated by the heating device 108 to heat the first surface 106. The exact relationship between the heating device 108 and the first surface 106 will depend upon such factors including the construction of the vaporization chamber 102, the type of heating device 108 used, and the intended solid precursor material 112. For example, the heating device 108 may comprise a fast response heater such as a thermoelectric heater that is based upon the thermoelectric (Peltier) effect. The temperature control 110 can be implemented as any device that adjusts the temperature output by the heating device 108. For example, the temperature control 110 may comprise an analog switch, circuit, a PID temperature controller or other digital circuit.

As a solid precursor material 112 sublimates, the shape and morphology of the remaining solid precursor material 112 changes. The changing volume of the solid precursor results in a continuously changing rate of vaporization. As such, the heating device 108 is preferably capable of regulating the temperature of the first surface 106 over a wide range of temperatures, room temperature to 400 degrees Celsius for example. Further, the heating device 108 should be capable of rapid temperature change. For example, a change of 20–30 degrees within milliseconds is preferable. The present invention is in no way limited by the rate in which the heating device 108 can change temperatures, however, as explained more fully herein, results of controlling vapor flow may vary depending upon the ability of the heating device 108 to change temperature.

The vapor 114 travels out the vaporization chamber 102 and into a delivery line 116. The delivery line 116 comprises any tubing or conduit suitable for routing the vapor 114. A flow monitor 118 is positioned along the delivery line 116 in such a manner as to be able to measure the vapor flow therethrough. As illustrated, the flow monitor 118 is positioned inline with the delivery line 116 such that a first delivery line section 120 routes the vapor 114 from the vaporization chamber 102 to the flow monitor 118, and a second delivery line section 122 routes the vapor 114 from the flow monitor 118 to a deposition chamber 124.

The vapor 114 flows through the deposition chamber 124 and onto one or more substrates, wafers, or other surfaces 126. Residual vapor is drawn from the deposition chamber 124 through the exhaust port 128 by the pump 130. The deposition chamber 124 is also sometimes referred to as a process chamber, reactor chamber, or deposition reactor. It will be appreciated that the vapor delivery system 100 of the present invention can be configured to supply vaporized solid precursors to any deposition chamber 124 for material deposition performed using established CVD or any other deposition processes as are known in the art.

The flow monitor 118 comprises a device capable of accurately measuring the vapor flow therethrough. The flow monitor 118 must be capable of generating accurate flow measurements at both high temperatures and low inlet and outlet pressures with minimal and preferably no restriction to the vapor flow. The high temperatures and low pressures are required to maintain the solid precursor material 112 in the vapor phase. As illustrated, the flow monitor 118 comprises an inlet 132, an outlet 134, a flow sensor 136, and associated electronics 140. The flow monitor 118 may also optionally include therein, a flow restrictor 138, a pressure sensor 142, a temperature sensor 144, or both. The electronics 140 provides the ability to output the measured flow, and optional temperature and pressure measurements. The electronics 140 may also perform calculations or processes required by the flow monitor 118.

The flow monitor 118 may be implemented for example, as either an analog or digital mass flow controller. However, a digital mass flow controller based upon either pulsed gate flow or sonic nozzle technologies are preferred due to the accuracy and control afforded by such devices. It will be appreciated that the flow monitor 118 may require additional hardware depending upon its implementation. For example, a thermal mass flow controller gas stick may require additional components such as pressure transducers, filters, bypass valves, and in some cases, pressure regulators (not shown). Further, some mass flow controllers determine vapor flow based upon a measured pressure. As such, one pressure sensor and the appropriate electronics can output both the vapor flow and pressure. Accordingly, one physical sensor or device can embody one or more of the sensors schematically illustrated herein.

The flow monitor 118 is capable of controlling the flow rate into the deposition chamber 124. By controlling the flow rate into the deposition chamber 124, the deposition rate of the solid precursor material 112 onto the surface of the substrate 126 positioned within the deposition chamber 124 is controlled. The flow monitor 118 controls the flow rate of the vapor 114 into the deposition chamber 124 by choking the flow of vapor in the first delivery line section 120 to let the desired amount of flow through. This is accomplished for example, by closing the flow restrictor 138 within the flow monitor 118. However, as the flow is choked off, the pressure upstream of the flow restrictor 138 increases. Should the pressure rise too much, condensation will occur as the vaporized solid precursor material 112 transforms back into the solid phase. If the solid precursor material 112 transforms from the vapor phase back to the solid phase, the flow monitor 118 and first delivery line section 120 can clog, jam, or otherwise suffer performance degradation.

To maintain the solid precursor material 112 in the vapor phase, a controller 146 is used to adjust the temperature of the heating device 108 to account for detected or expected changes in pressure. The controller 146 has a first input 148 coupled to the flow monitor 118. The first input 148 receives as an input, the vapor flow measured by the flow monitor 118. The controller 146 further includes a first output 150 coupled to the temperature control 110 of the heating device 108. The first output 150 is arranged to adjust the temperature generated by the heating device 108 in such a manner to control the flow of vapor 114 through the vapor delivery system 100. By reducing the flow of vapor 114, the pressure in the first delivery line section 120 is also reduced.

It will be appreciated that the controller 146 can be implemented in a number of ways. For example, the controller 146 may be implemented as dedicated hardware, as a microprocessor based circuit, as a dedicated turnkey computer system, or a general-purpose computer running the appropriate software to implement the present invention.

Figure 2:
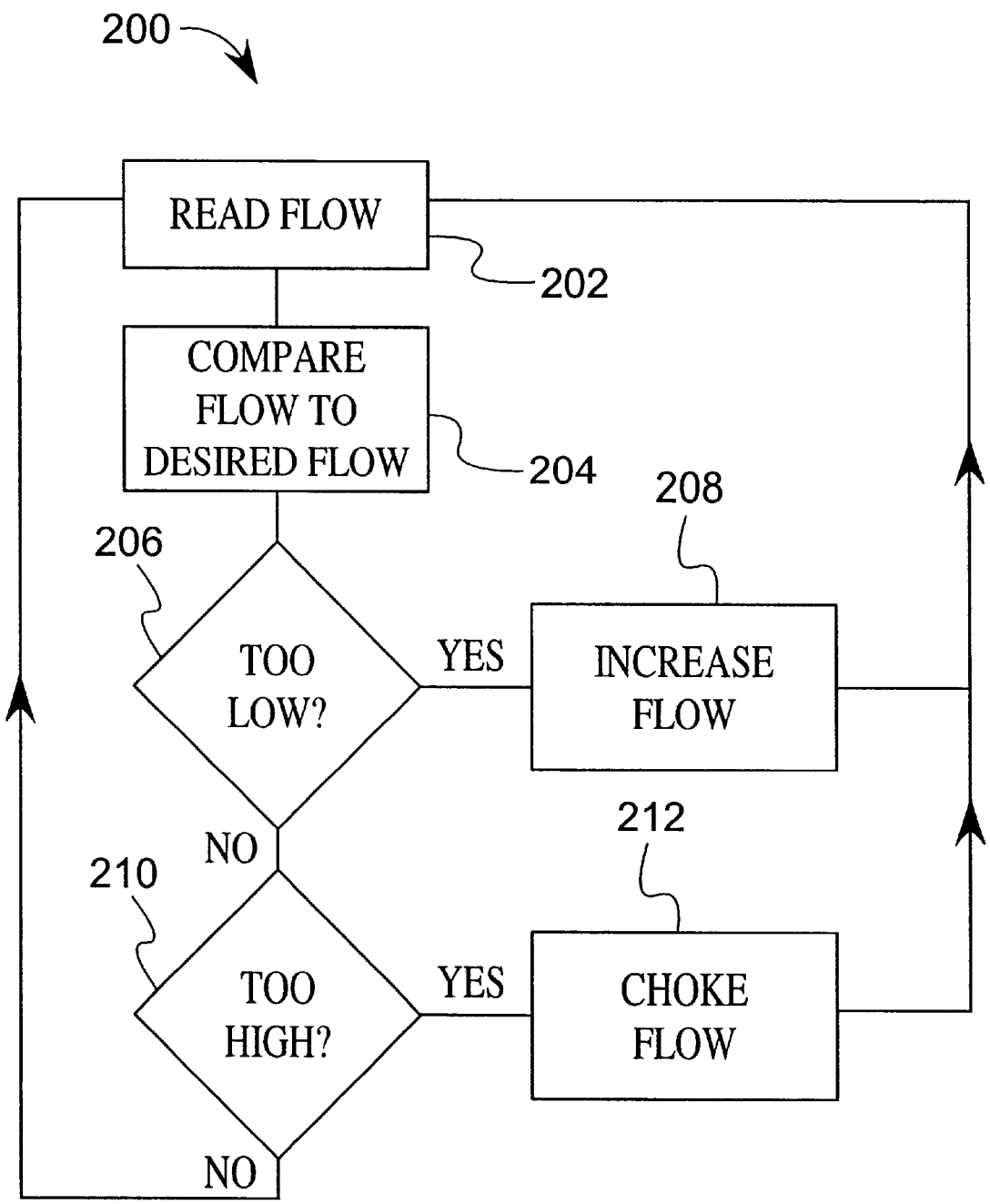
FIG. 2 is a flow chart illustrating a simplified controller scheme.

Referring now to FIG. 2, a controller scheme 200 is illustrated. The measured vapor flow is read in block 202. The measured vapor flow is then compared to a desired vapor flow in block 204. In decision block 206, the measured vapor flow is tested to determine whether the measured vapor flow is at too low a rate for the given deposition process. If the measured flow rate is too low, the flow rate is increased in block 208, and a new measurement is taken by feeding back control to block 202. If the measured flow is not too low, the measured flow is tested to determine whether it is too high in block 210. If the measured flow is too high, the flow rate is reduced or choked in block 212 and a new measurement is taken by feeding back control to block 202. Otherwise, the flow rate is acceptable, and control is fed back to block 202 to take a new measurement. It will be understood that this flow chart is only representative of the possible implementations of the invention more fully described herein. Further, the desired flow may actually be represented as a range of acceptable flows.

Referring back to FIG. 1 with reference to FIG. 2, for a given solid precursor material 112, the controller 146 (such as a general purpose computer) has preprogrammed therein, a desired flow rate or range of acceptable flow rates to achieve a desired deposition layer. When the deposition process begins, the controller 146 reads the measured flow and compares the measured flow to the desired flow rate. If the measured vapor flow is too low, the controller 146 adjusts the temperature of the first surface 106 of the vaporization chamber 102 by sending a control signal to the temperature control 110 of the heating device 108 to affect the necessary adjustment, for example, to increase the temperature of the first surface 106. If the measured flow exceeds the desired flow, the output of the controller 146 signals the temperature control 110 to reduce the temperature applied to the first surface 106 of the vaporization chamber 102 thus lowering the quantity of solid precursor material 112 that vaporizes and thus reduces the vapor flow. It will be appreciated that the amount of a particular adjustment will depend upon the type of solid precursor, the response time of the heating device 108 used, the reaction time of the flow monitor 118 to determine the vapor flow rate, and other factors. Further, the desired flow rate may have different values during various portions of the deposition process. The system continues to monitor the vapor flow through the flow monitor 118 and make adjustments as necessary until the deposition process is complete.

Figure 3:
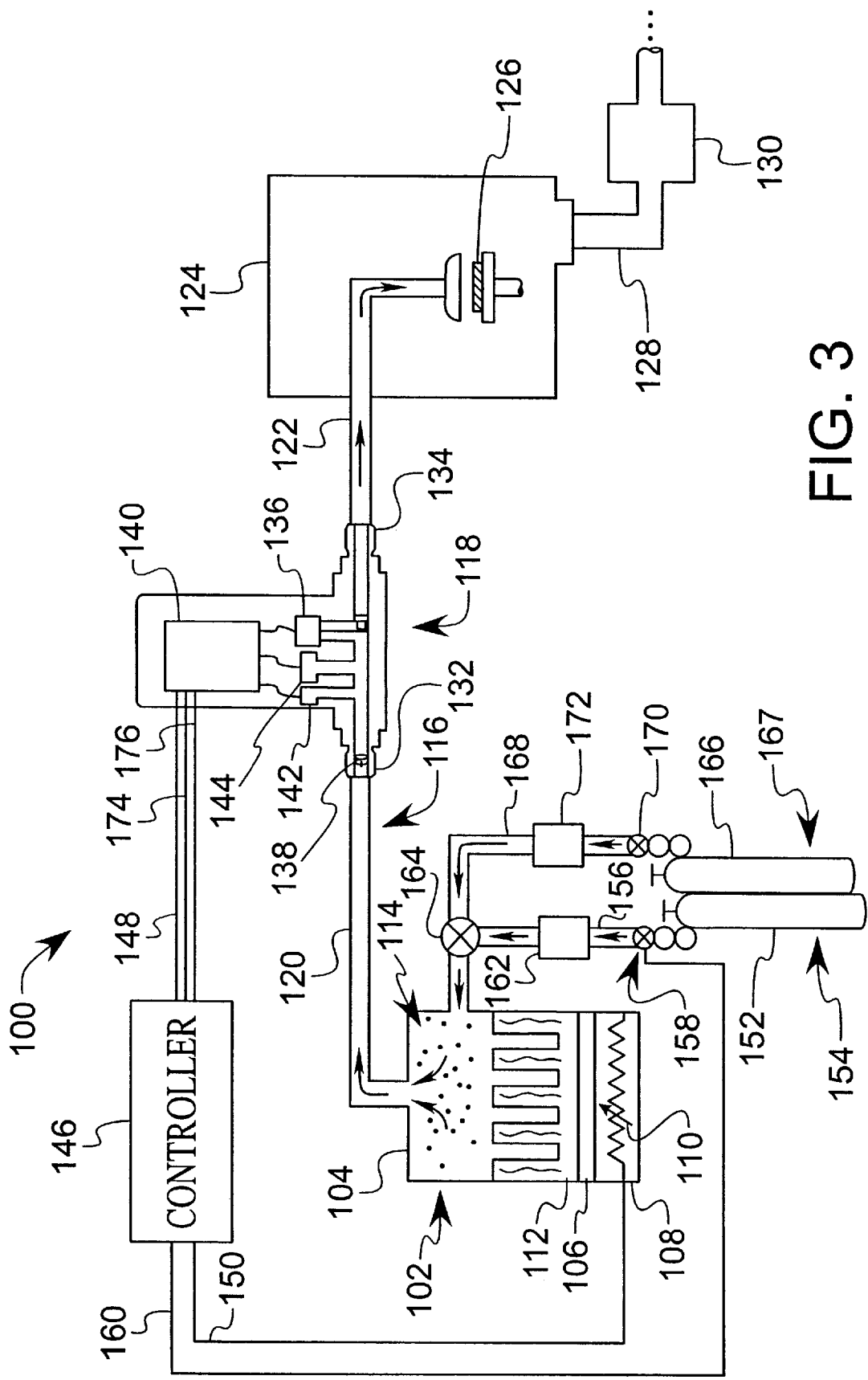
FIG. 3 is a schematic illustration of the vapor delivery system of FIG. 1, further illustrating multiple controller inputs and the use of a pressure regulator.

The vapor delivery system 100 optionally includes pressure regulation to assist in maintaining the solid precursor material 112 in the vapor phase. There are a number of ways to accomplish pressure regulation. According to one embodiment of the present invention, an inert gas is fed into the delivery line 116 as illustrated in FIG. 3. The inert gas 152 is provided by a gas source 154 and is fed into the vaporization chamber 102 through a gas line 156. A flow regulator 158 is provided to control the amount of inert gas 152 that enters the vaporization chamber 102. The controller 146 optionally comprises a second output 160 that couples to the flow regulator to adjust the amount of inert gas 152 that is introduced during deposition processing.

It will be observed that any number of optional flow monitors 162 and valves 164 may be positioned inline with the gas line 156 before entering the inlet of the vaporization chamber 102. Further, while schematically, the second output 160 of the controller 146 is illustrated as being coupled to the flow regulator 158, it will be understood that other control schemes may be implemented. For example, if an optional flow monitor 162, such as a digitally controlled mass flow controller is positioned inline with the gas line, the second output 160 of the controller 146 may couple to the mass flow controller to regulate the amount of inert gas 152 that enters the vaporization chamber 102 and delivery line 116.

Additionally, depending upon the selection of solid precursor material 112, an optional carrier gas 166 may be used to assist the vapor 114 in transmitting from the vaporization chamber 102 to the deposition chamber 124. It will be appreciated that the carrier gas 166 is supplied by the carrier gas source 167 and may utilize a second gas line 168, flow regulator 170, flow monitor 172, and other components as is known in the art. The carrier gas 166 may be fed into the vaporization chamber 102 using a second inlet (not shown), or alternatively, the carrier gas 166 may tie into the inert gas line 156 downstream from the inert gas flow regulator 158.

If the flow monitor 118 includes the optional pressure sensor 142 and is capable of generating an output signal representing the measured pressure, this signal may be fed into the controller 146 as a second input 174. Likewise, if the flow monitor 118 includes the optional temperature sensor 144 and is capable of generating an output signal representing the measured temperature, this signal may be fed into the controller 146 as a third input 176.

The addition of measured pressure and temperature data allows for more sophisticated processing by the controller 146. For example, the controller 146 contains predetermined data that provides the temperature and pressure conditions required to maintain a particular solid precursor in the vapor phase. This information may be stored for example, in the form of a formula or lookup table. Based upon given temperature conditions, a guard band, or range of acceptable pressures is determined. The guard band will vary depending upon the type of solid precursor being sublimated for deposition processing. The controller 146 can now monitor both the flow rate to ensure proper deposition processing, and make sure the pressure is maintained within the guard band to avoid condensation from forming in the flow monitor 118 and delivery line 116.

Figure 4:
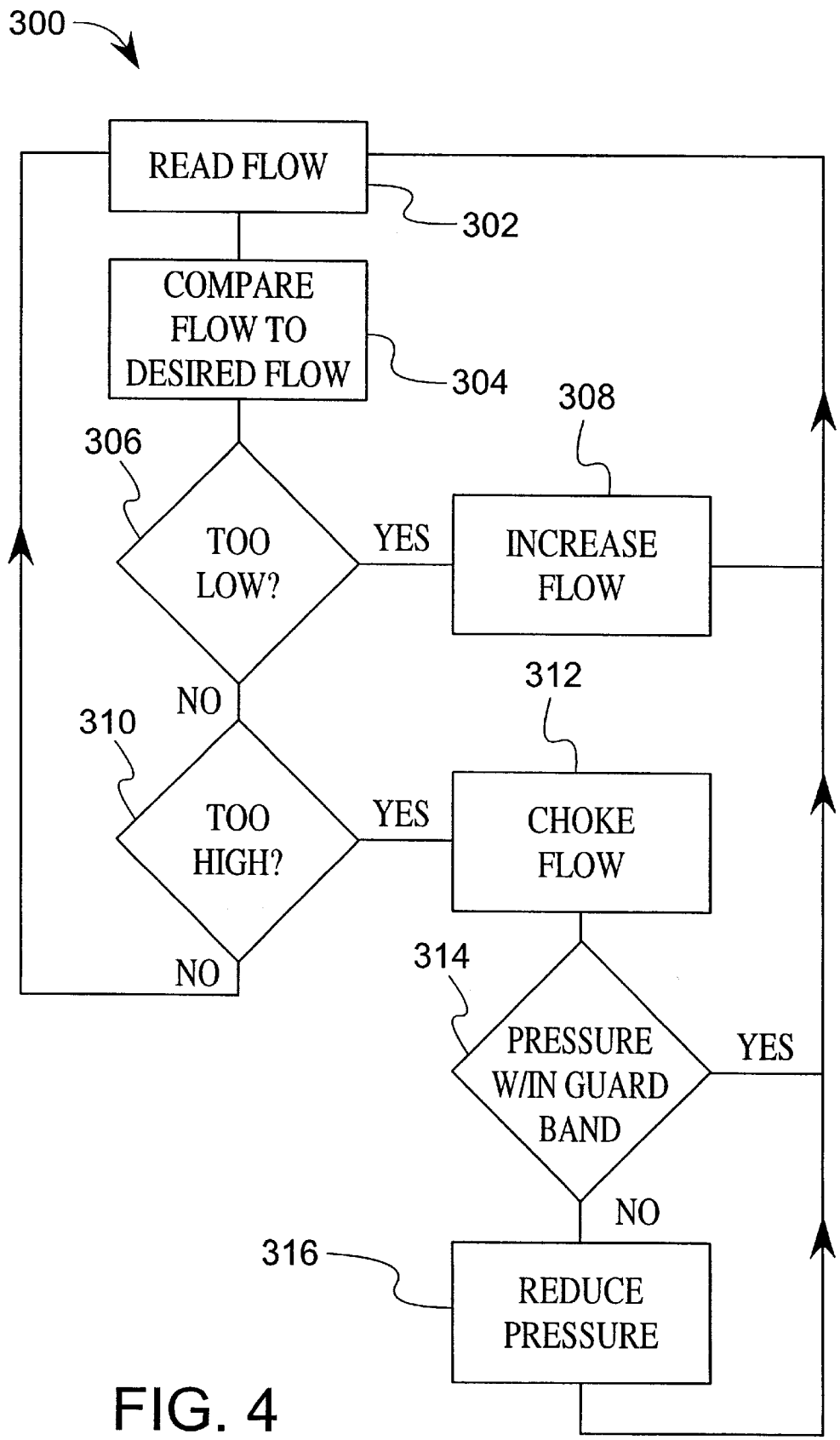
FIG. 4 is a flow chart illustrating a simplified controller scheme incorporating a check to determine whether vapor is within a pressure guard band.

Referring now to FIG. 4, a controller scheme 300 including pressure guard band testing is illustrated. The measured vapor flow is read in block 302. The measured vapor flow is then compared to a desired vapor flow in block 304. In decision block 306, the measured vapor flow is tested to determine whether the measured vapor flow is at too low a rate for the given deposition process. If the measured flow rate is too low, the flow rate is increased in block 308, and a new measurement is taken by feeding back control to block 302. If the measured flow is not too low, the measured flow is tested to determine whether it is too high in block 310. If the measured flow is not too high, then control is fed back to block 302 and a new flow measurement is taken. If the measured flow is too high, the flow rate is reduced or choked in block 312. The measured pressure is checked against the pressure guard band in block 314 if the measured pressure is within the guard band, a new flow measurement is taken by feeding back control to block 302. If the measured pressure is outside the guard band, the pressure is reduced in block 316. It will be understood that this flow chart is only representative of the possible implementations of the invention more fully described herein. Further, the desired flow may actually be represented as a range of acceptable flows.

Referring back to FIG. 3, it will be appreciated that the temperature input can also come from the heating device 108. For example, the heating device 108 may have a temperature output that couples to the third input 176 of the controller 146. Under such an arrangement, the temperature sensor 144 in the flow monitor 118 is not required. It will be appreciated that numerous factors affect the decision to use a separate temperature sensor or whether the heating device 108 can generate sufficient temperature measurements including for example, the length of the first delivery line section 120 and the type of outputs available on the heating device 108.

Figure 5:
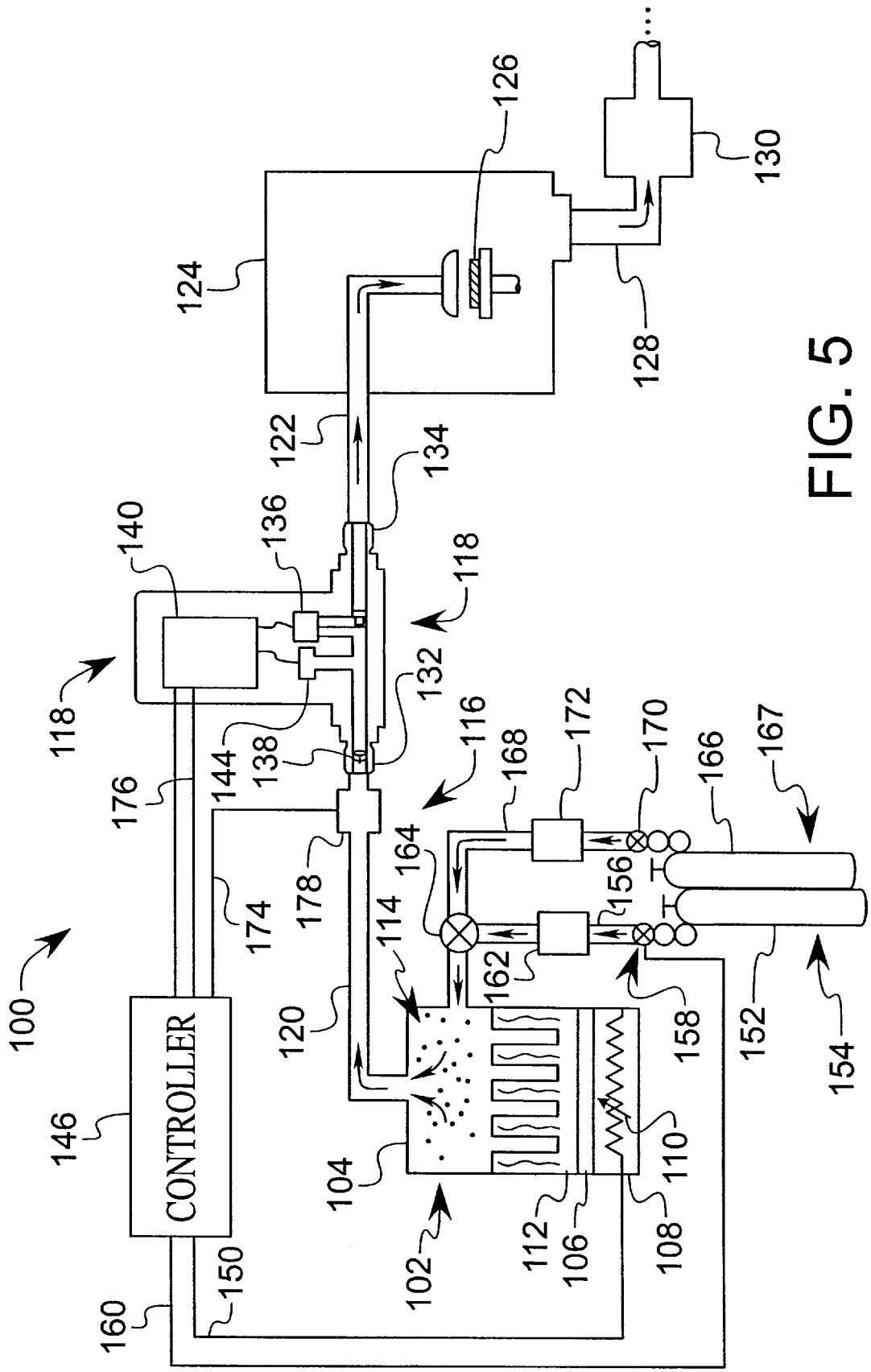
FIG. 5 is a schematic illustration of the vapor delivery system of FIG. 1, further illustrating an external pressure sensor positioned along the delivery line upstream of a flow monitor.

The optional temperature and pressure sensors 142, 144 need not physically reside within the flow monitor 118. Referring to FIG. 5, the flow monitor 118 does not include a built in pressure sensor. Rather, a pressure sensor 178 is provided in line with the delivery line 116. It is preferable to locate the pressure sensor 178 proximate to, and upstream from the flow monitor 118, however, the pressure sensor 178 may also be positioned downstream of the flow monitor 118. Further, the pressure sensor 178 may be positioned in any desired position along the delivery line 116. It will be appreciated that a temperature sensor may also be positioned along the delivery line 116 (not shown) in a similar fashion as that described for the pressure sensor 178.

Figure 6:
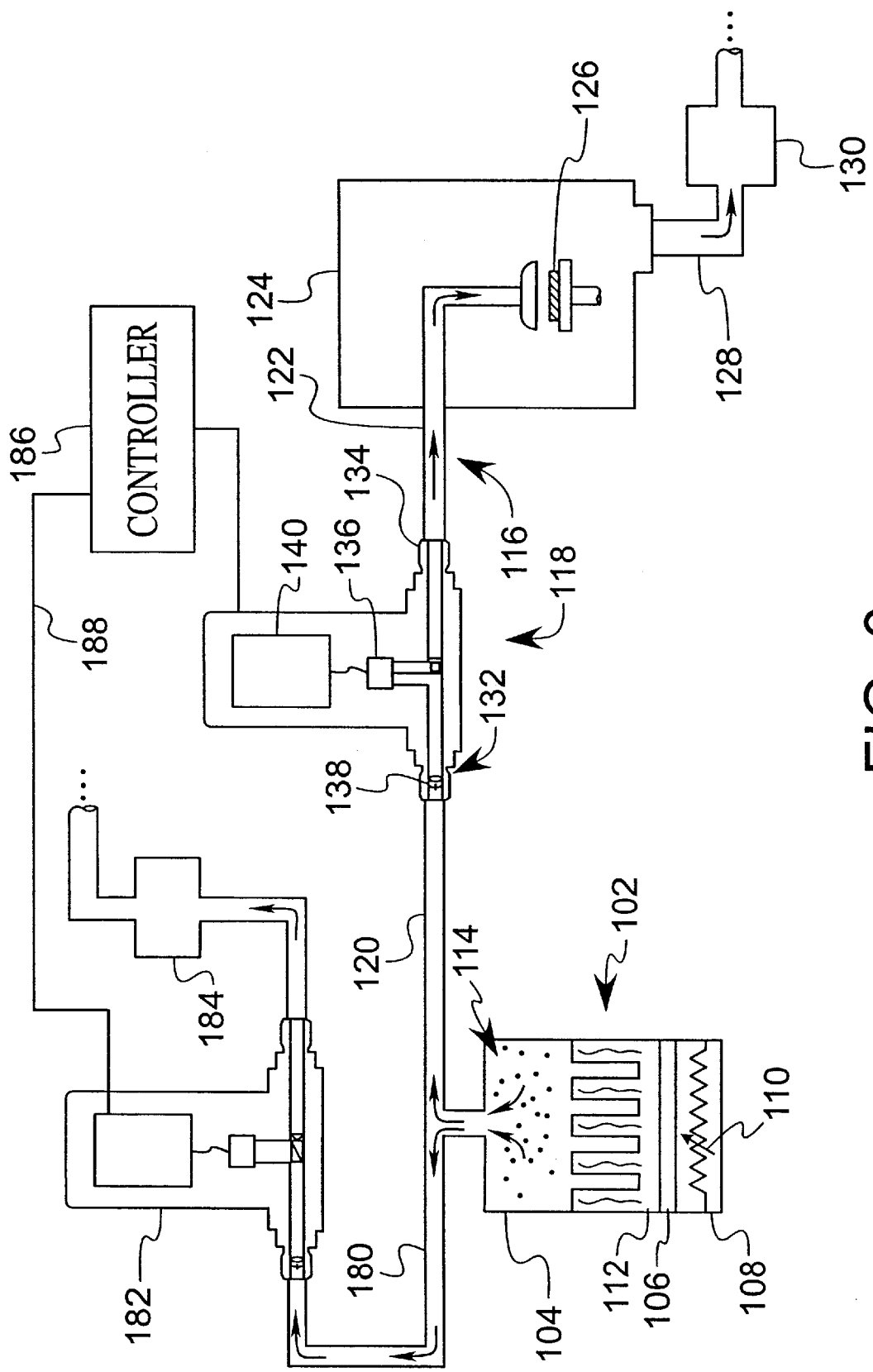
FIG. 6 is a schematic illustration of a vapor delivery system for deposition processing according to another embodiment of the present invention.

Referring to FIG. 6, a vapor delivery system according to another embodiment of the present invention is illustrated. As pointed out above, the flow monitor 118 controls the flow rate of the vapor 114 into the deposition chamber 124 through the second delivery line section 122 by choking the flow of vapor in the first delivery line section 120 to let the desired amount of flow through. However, as the vapor flow is choked off, pressure upstream of the flow monitor 118 increases. Whereas an embodiment of the present invention discussed above with reference to FIGS. 1–5 offsets the increased pressure during choked off periods by adjusting the temperature of the heating device 108, the embodiment illustrated in FIG. 6 offsets the increased pressure by bleeding off excess vapor 114.

The delivery line 116 further includes a third delivery line section 180 that couples to the first delivery line section 120 upstream of the flow monitor 118. A valve 182 is positioned inline with the third delivery line section 180, and a pump 184 is provided to draw vapor 114 in the direction of the third delivery line section 180. The valve 182 can be any implemented with any number of valve arrangements, including a mass flow controller. For example, the valve 182 may comprise a pulsed gate flow or sonic nozzle mass flow controller 146. Digital valves and pulsed gate flow devices are preferred over analog counterparts due to the fast response time and control typically afforded by such devices.

The controller 186 includes a first output 188 coupled to the valve 182, and the logic in the controller 186 is configured to adjust the valve 182 to selectively bleed off vapor 114 in the first delivery line section 120 by siphoning excess vapor 114 through the third delivery line section 180. That is, the measured vapor flow is compared to a predetermined vapor flow. If the measured vapor flow exceeds the desired vapor flow, any excess vapor is bled of by opening the valve 182 to draw a portion of the vapor 114 into the third delivery line section 180 and away from the flow monitor 118. The controller 186 inputs and variations thereof are similar to those described more fully herein with reference to FIGS. 1–5.

The heating device 108 is schematically illustrated as having a variable temperature control 110 because the temperature applied to the first surface 106 may require adjustment when switching from one solid precursor material 112 to the next. However, in this embodiment, it is not required that the heating device 108 be a fast response heater.

Figure 7:
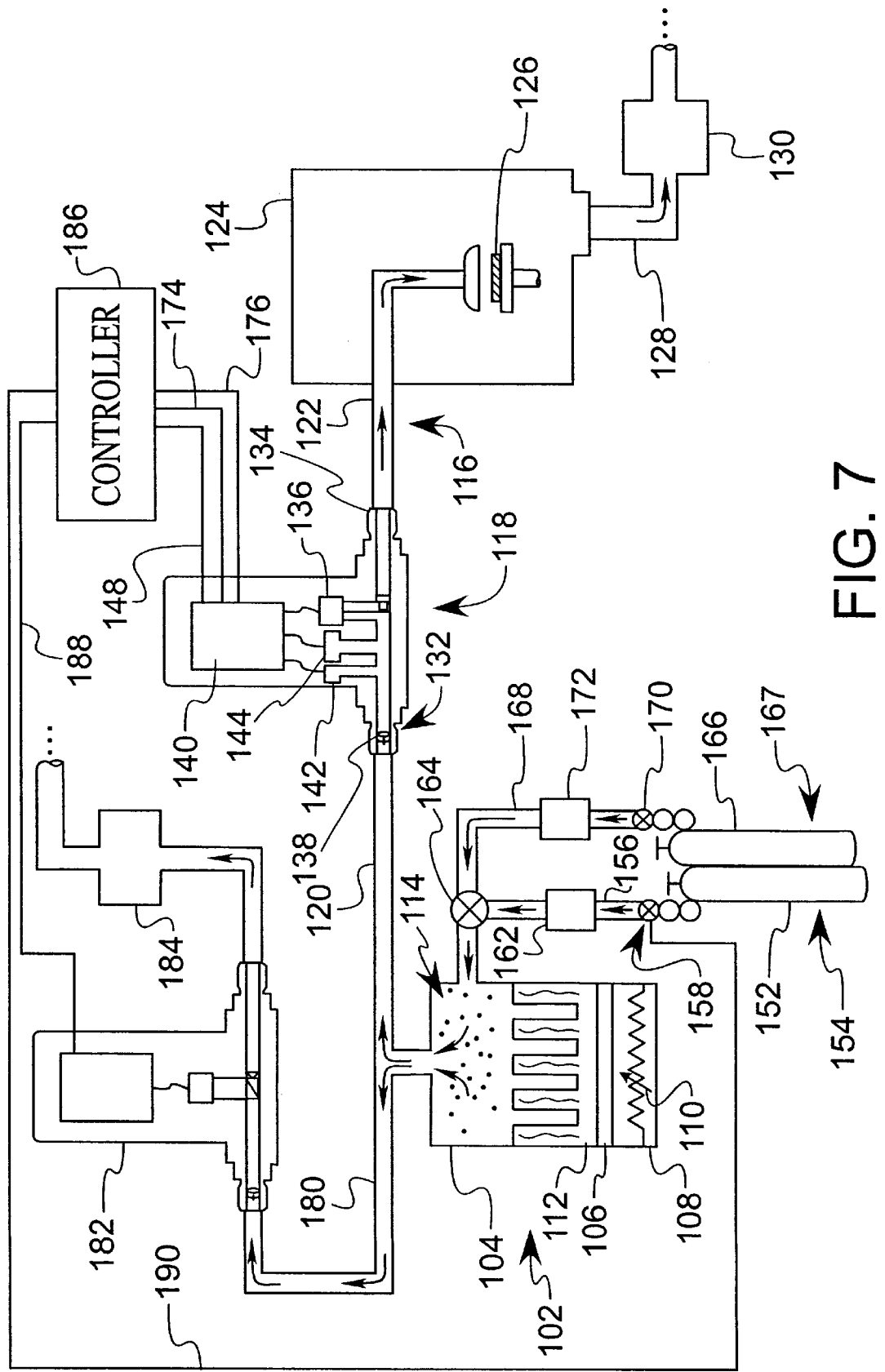
FIG. 7 is a schematic illustration of the vapor delivery system of FIG. 4, further illustrating the use of a pressure regulator; and, FIG. 8 is a schematic illustration of a vapor delivery system for deposition processing according to another embodiment of the present invention.

FIG. 7 illustrates the embodiment as illustrated in FIG. 6 with the addition of optional pressure regulation to assist in maintaining the solid precursor material 112 in the vapor phase. Similar to the pressure system discussed with reference to FIG. 3, the inert gas 152 is provided by the gas source 154 and is fed into the vaporization chamber 102 through the gas line 156. A flow regulator 158 is provided to control the amount of inert gas 152 that enters the vaporization chamber 102. The controller 186 optionally comprises a second output 190 that couples to the flow regulator 158 to adjust the amount of inert gas 152 that is introduced during deposition processing. Further, depending upon the selection of solid precursor material 112, an optional carrier gas 166 may be used to assist the vapor 114 in transmitting from the vaporization chamber 102 to the deposition chamber 124. The carrier gas 166 is provided by a carrier gas source 167, and is fed into the vaporization chamber 102 using a second gas line 168, flow regulator 170, and other components separate from the inert gas source 154. FIG. 7 also illustrates the use first, second and third controller inputs 148, 174, and 176 from the flow sensor 136, pressure sensor 142, and temperature sensor 144 respectively. As previously described herein, the pressure and temperature sensors 142, 144 are optional.

Figure 8:
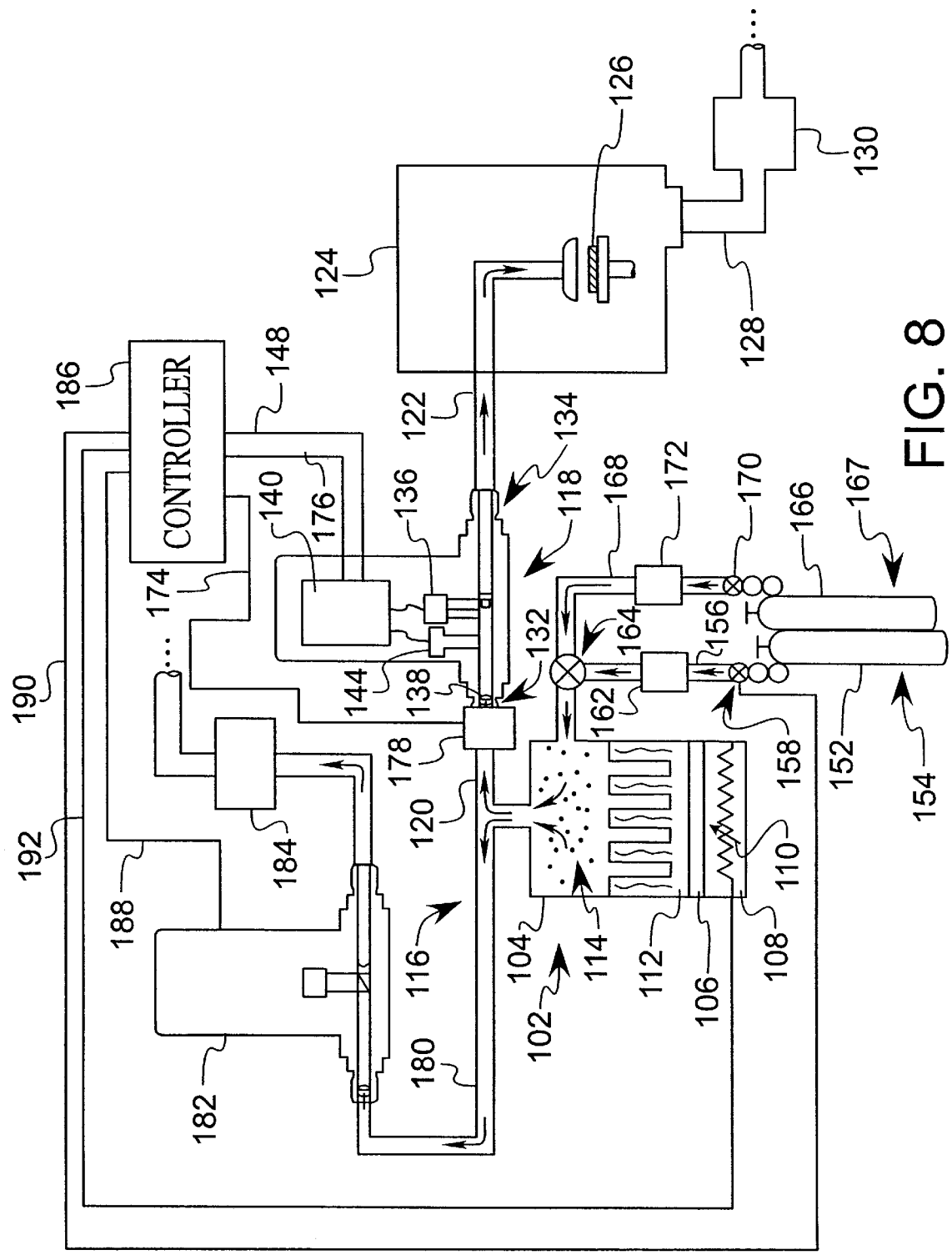

FIG. 8 illustrates another embodiment of the present invention. The vapor delivery system is similar to that described with reference to FIGS. 6–7, and further includes a third output 192 that feeds back control from the controller 186 to the temperature control 110 of the heating device 108. This structure allows a high degree of flexibility in the implementation of the controller 186. For example, according to one embodiment of the present invention, the controller 186 is configured to adjust the temperature of the first surface 106 when coarse adjustments are required to the vapor flow. The controller 186 is configured to regulate the valve 182 when fine adjustments are required. It will be appreciated that depending upon such factors as the ability of the pump 184 to create a vacuum and the length of the third delivery line section 180, the opening and closing the valve 182 can result in faster response times than regulating the heating device 108.

According to another embodiment of the present invention, the controller 186 is arranged to regulate the valve 182 and adjust the temperature applied to the first surface 106 by adjusting the temperature control 110 generally at the same time. Alternatively, the controller 186 adjusts vapor flow by adjusting the third output 192 to change the temperature of the heating device 108, and thus affecting vapor flow, and adjusting the first and second outputs 188, 190 to adjust for measured pressure.

While illustrated having a pressure sensor 178 and a flow sensor 118 that includes a built in temperature sensor 144, it will be appreciated that the inputs to the controller 186 can include any of the configurations discussed above with reference to FIGS. 1–7.

Although the invention described above with reference to FIGS. 1-8 are illustrated with a single vaporization chamber 102 and a single solid precursor material 112, it will be appreciated that any number of vaporization chambers 102 may feed into a single deposition chamber 124 using the techniques, methods, and system described herein.

Further, any number of additional features of conventional vapor delivery systems may be used with the present invention as is known in the art. For example, optional delivery line heaters may be used to maintain the solid precursor in the vapor phase. The use of delivery line heaters may be advantageous under conditions where excessive line length is required to deliver the solid precursor.

Having described the invention in detail and by reference to preferred embodiments thereof, it will be apparent that modifications and variations are possible without departing from the scope of the invention defined in the appended claims.

What is claimed is:

1. A vapor delivery system for a solid precursor comprising:
   a vaporization chamber;
   a first surface within said vaporization chamber, said first surface arranged to hold a solid precursor material;
   a heating device having a temperature control, said temperature control arranged to vary the temperature of said heating device over a range of temperatures, at least a portion of the temperatures within said range of temperatures sufficient to transform said solid precursor material to a vapor, wherein said heating device is arranged to transfer heat to said first surface;
   a delivery line coupled to said vaporization chamber;
   a flow monitor arranged to measure the flow of said vapor through said delivery line; and,
   a controller having a first input coupled to said flow monitor and a first output coupled to said temperature control of said heating device, said controller arranged to control the supply of said vapor to said delivery line by varying said first output to adjust the temperature of said heating device based upon the measured flow of said vapor at said first input.

2. A vapor delivery system for a solid precursor according to claim 1, wherein said heating device comprises a thermoelectric heating device.

3. A vapor delivery system for a solid precursor according to claim 1, wherein said heating device is arranged to heat said first surface to a temperature sufficient to sublimate said solid precursor material.

4. A vapor delivery system for a solid precursor according to claim 1, wherein said controller comprises a microprocessor based controller.

5. A vapor delivery system for a solid precursor according to claim 1, wherein said controller comprises a general purpose computer.

6. A vapor delivery system for a solid precursor according to claim 1, wherein said flow monitor comprises a pulsed gate flow mass flow controller.

7. A vapor delivery system for a solid precursor according to claim 1, wherein said flow monitor comprises a sonic nozzle mass flow controller.

8. A vapor delivery system for a solid precursor according to claim 1, further comprising a pressure sensor arranged to measure the pressure of said vapor within said delivery line, wherein said controller has a second input coupled to said pressure sensor, said second input receiving as a second input signal the measured pressure of said vapor.

9. A vapor delivery system for a solid precursor according to claim 8, wherein said controller is arranged to vary said first output to adjust the temperature of said heating device based upon the measured pressure of said pressure sensor.

10. A vapor delivery system for a solid precursor according to claim 9, wherein said controller is arranged to compare said measured pressure against a guard band range of pressures, and said controller varies said first output to adjust the temperature of said heating device if said measured pressure is outside of said guard band range of pressures.

11. A vapor delivery system for a solid precursor according to claim 1, further comprising a temperature sensor arranged to measure the temperature of said vapor within said delivery line, wherein said controller has a second input coupled to said temperature sensor, said second input receiving as a second input signal the measured temperature of said vapor.

12. A vapor delivery system for a solid precursor according to claim 1, further comprising a gas source coupled to an inlet in said vaporization chamber, wherein said gas source is arranged to supply a gas to said delivery line, said gas transferred to said delivery line to regulate the pressure within said delivery line.

13. A vapor delivery system for a solid precursor according to claim 12, wherein said controller further comprises a second output adapted to adjust the amount of said gas that is supplied to said delivery line by said gas source.

14. A vapor delivery system for a solid precursor according to claim 12, wherein said gas comprises an inert gas.

15. A vapor delivery system for a solid precursor comprising:
   a vaporization chamber;
   a first surface within said vaporization chamber, said first surface arranged to hold a solid precursor material;
   a heating device having a temperature control, said temperature control arranged to vary the temperature of said heating device over a range of temperatures, at least a portion of the temperatures within said range of temperatures sufficient to transform said solid precursor material to a vapor, wherein said heating device is arranged to transfer heat to said first surface;

a delivery line coupled to said vaporization chamber;

a flow monitor arranged to measure the flow of said vapor through said delivery line;

a pressure sensor arranged to measure the pressure of said vapor within said delivery line;

a gas source coupled to an inlet in said vaporization chamber, said gas source arranged to supply an inert gas to said delivery line; and, a controller, said controller having:
  a first input coupled to said flow monitor;
  a second input coupled to said pressure sensor;
  a first output coupled to said temperature control of said heating device, and,
  a second output coupled to said gas source, wherein said controller is arranged to control the supply of said vapor to said delivery line by varying said first output to adjust the temperature of said heating device based upon the measured flow of said vapor at said first input, and by varying said second output to adjust the flow of said inert gas based upon the measured pressure of said vapor at said second input.

16. A vapor delivery system for a solid precursor comprising:

a vaporization chamber;

a first surface within said vaporization chamber, said first surface arranged to hold a solid precursor material;

a heating device having a temperature control, said temperature control arranged to vary the temperature of said heating device over a range of temperatures, at least a portion of the temperatures within said range of temperatures sufficient to transform said solid precursor material to a vapor, wherein said heating device is arranged to transfer heat to said first surface;

a delivery line coupled to said vaporization chamber;

a flow monitor arranged to measure the flow of said vapor through said delivery line;

a pressure sensor arranged to measure the pressure of said vapor within said delivery line;

a temperature sensor arranged to measure the temperature of said vapor within said delivery line;

a gas source coupled to an inlet in said vaporization chamber, said gas source arranged to supply an inert gas to said delivery line;

a flow regulator coupled between said gas source and said inlet in said vaporization chamber, and, a controller, said controller having:
  a first input coupled to said flow monitor;
  a second input coupled to said pressure sensor;
  a third input coupled to said temperature sensor;
  a first output coupled to said temperature control of said heating device, and,
  a second output coupled to said flow regulator, wherein said controller is arranged to control the supply of said vapor to said delivery line by varying said first output to adjust the temperature of said heating device based upon the measured flow of said vapor at said first input, and by varying said second output to adjust the flow of said inert gas through said flow regulator, based upon the measured pressure of said vapor at said second input, and the measured temperature of said vapor at said third input.

17. A chemical vapor deposition system comprising:

a vaporization chamber;

a first surface within said vaporization chamber, said first surface arranged to hold a solid precursor material;
  a heating device having a temperature control, said temperature control arranged to vary the temperature of said heating device over a range of temperatures, at least a portion of the temperatures within said range of temperatures sufficient to transform said solid precursor material to a vapor, wherein said heating device is arranged to transfer heat to said first surface;

a deposition chamber;

a delivery line arranged to couple said vaporization chamber to said deposition chamber;

a flow monitor arranged to measure the flow of said vapor through said delivery line; and,
  a controller having a first input coupled to said flow monitor and a first output coupled to said temperature control of said heating device, said controller arranged to control the supply of said vapor to said delivery line by varying said first output to adjust the temperature of said heating device based upon the measured flow of said vapor at said first input.

18. A vapor delivery system for a solid precursor comprising:

a vaporization chamber;

a first surface within said vaporization chamber, said first surface arranged to hold a solid precursor material;

a heating device arranged to heat said first surface sufficient to transform said solid precursor material to a vapor;

a delivery line coupled to said vaporization chamber, said delivery line arranged to route said vapor in a first direction and a second direction;

a first flow monitor arranged to measure the flow of said vapor through said delivery line in said first direction;

a first valve arranged to regulate the flow of said vapor through said delivery line in said second direction;

a first pump coupled to said delivery line, said first pump arranged to draw vapor through said delivery line in said second direction; and, a controller having a first input coupled to said first flow monitor and a first output coupled to said first valve, said controller arranged to bleed off excess amounts of said vapor located in said first direction of said delivery line by varying said first output to adjust said valve based upon the measured flow of said vapor at said first input.

19. A vapor delivery system for a solid precursor according to claim 18, wherein said controller comprises a microprocessor based controller.

20. A vapor delivery system for a solid precursor according to claim 18, wherein said controller comprises a general purpose computer.

21. A vapor delivery system for a solid precursor according to claim 18, wherein said first flow monitor comprises a pulsed gate flow mass flow controller.

22. A vapor delivery system for a solid precursor according to claim 18, wherein said first flow monitor comprises a sonic nozzle mass flow controller.

23. A vapor delivery system for a solid precursor according to claim 18, further comprising a pressure sensor arranged to measure the pressure of said vapor within said delivery line in said first direction, wherein said controller has a second input coupled to said pressure sensor, said second input receiving as a second input signal the measured pressure of said vapor.

24. A vapor delivery system for a solid precursor according to claim 23, wherein said controller is arranged to vary said first output to adjust said first valve based upon the measured pressure of said pressure sensor.

25. A vapor delivery system for a solid precursor according to claim 24, wherein said controller is arranged to compare said measured pressure against a guard band range of pressures, and said controller varies said first output to adjust said first valve if said measured pressure is outside of said guard band range of pressures.

26. A vapor delivery system for a solid precursor according to claim 18, further comprising a temperature sensor arranged to measure the temperature of said vapor within said delivery line in said first direction, wherein said controller has a second input coupled to said temperature sensor, said second input receiving as a second input signal the measured temperature of said vapor.

27. A vapor delivery system for a solid precursor according to claim 18, further comprising a gas source coupled to an inlet in said vaporization chamber, wherein said gas source is arranged to supply a gas to said delivery line, said gas transferred to said delivery line to regulate the pressure within said delivery line.

28. A vapor delivery system for a solid precursor according to claim 27, wherein said controller further comprises a second output coupled to said flow regulator, said second output adapted to adjust the amount of said gas that is supplied to said delivery line by said gas source.

29. A vapor delivery system for a solid precursor according to claim 28, wherein said gas comprises an inert gas.

30. A vapor delivery system for a solid precursor according to claim 18, wherein said first valve comprises a digital valve.

31. A vapor delivery system for a solid precursor according to claim 18, wherein said first valve comprises a pulsed gate valve.

32. A vapor delivery system for a solid precursor according to claim 18, wherein said first valve is positioned upstream of said first flow monitor.

33. A vapor delivery system for a solid precursor comprising:
a vaporization chamber;
a first surface within said vaporization chamber, said first surface arranged to hold a solid precursor material;
a heating device arranged to heat said first surface sufficient to transform said solid precursor material to a vapor;
a delivery line coupled to said vaporization chamber, said delivery line arranged to route said vapor in a first direction and a second direction;
a first flow monitor arranged to measure the flow of said vapor through said delivery line in said first direction;
a first pressure sensor arranged to measure the pressure of said vapor within said delivery line in said first direction;
a first valve arranged to regulate the flow of said vapor through said delivery line in said second direction;
a first pump coupled to said delivery line, said first pump arranged to draw vapor through said delivery line in said second direction;
a gas source coupled to an inlet in said vaporization chamber, said gas source arranged to supply an inert gas to said delivery line;
a flow regulator between said gas source and said inlet in said vaporization chamber; and,
a controller having:
a first input coupled to said first flow monitor;
a second input coupled to said first pressure sensor;
a first output coupled to said first valve; and,
a second output coupled to said flow regulator; wherein said controller is arranged to bleed off excess amounts of said vapor in said first direction of said delivery line by varying said first output to adjust said valve and by varying said second output to adjust the amount of said inert gas that is supplied to said delivery line by said gas source, based upon the measured flow of said vapor at said first input and the measured pressure of said vapor at said second input.

34. A vapor delivery system for a solid precursor comprising:
a vaporization chamber;
a first surface within said vaporization chamber, said first surface arranged to hold a solid precursor material;
a heating device arranged to heat said first surface sufficient to transform said solid precursor material to a vapor;
a delivery line coupled to said vaporization chamber, said delivery line arranged to route said vapor in a first direction and a second direction;
a first flow monitor arranged to measure the flow of said vapor through said delivery line in said first direction;
a first pressure sensor arranged to measure the pressure of said vapor within said delivery line in said first direction;
a first temperature sensor arranged to measure the temperature of said vapor within said delivery line in said first direction;
a first valve arranged to regulate the flow of said vapor through said delivery line in said second direction;
a first pump coupled to said delivery line, said first pump arranged to draw vapor through said delivery line in said second direction;
a gas source coupled to an inlet in said vaporization chamber, said gas source arranged to supply an inert gas to said delivery line;
a flow regulator between said gas source and said inlet in said vaporization chamber; and,
a controller having:
a first input coupled to said first flow monitor;
a second input coupled to said first pressure sensor;
a third input coupled to said first temperature sensor;
a first output coupled to said first valve; and,
a second output coupled to said flow regulator, wherein said controller is arranged to bleed off excess amounts of said vapor in said first direction of said delivery line by varying said first output to adjust said valve and by varying said second output to adjust the amount of said inert gas that is supplied to said delivery line by said gas source, based upon the measured flow of said vapor at said first input, the measured pressure of said vapor at said second input, and the measured temperature of said vapor at said third input.

35. A chemical vapor deposition system comprising:
a vaporization chamber;
a first surface within said vaporization chamber, said first surface arranged to hold a solid precursor material;

a heating device arranged to heat said first surface sufficient to transform said solid precursor material to a vapor;

a deposition chamber;

a delivery line arranged to couple said deposition chamber to said vaporization chamber, said delivery line having a first delivery line arranged to route said vapor in a first direction from said vaporization chamber toward said deposition chamber, and said delivery line having a second delivery line arranged to route said vapor in a second direction from said vaporization chamber away from said deposition chamber;

a first flow monitor arranged to measure the flow of said vapor through said delivery line in said first direction;

a first valve arranged to regulate the flow of said vapor through said delivery line in said second direction;

a first pump coupled to said delivery line, said first pump arranged to draw vapor through said delivery line in said second direction; and, a controller having a first input coupled to said first flow monitor and a first output coupled to said first valve, said controller arranged to bleed off excess amounts of said vapor in said first direction of said delivery line by varying said first output to adjust said valve based upon the measured flow of said vapor at said first input.

36. A vapor delivery system for a solid precursor comprising:

a vaporization chamber;

a first surface within said vaporization chamber, said first surface arranged to hold a solid precursor material;

a heating device having a temperature control, said temperature control arranged to vary the temperature of said heating device over a range of temperatures, at least a portion of the temperatures within said range of temperatures sufficient to transform said solid precursor material to a vapor, wherein said heating device is arranged to transfer heat to said first surface;

a delivery line coupled to said vaporization chamber, said delivery line arranged to route said vapor in a first direction and a second direction;

a first flow monitor arranged to measure the flow of said vapor through said delivery line in said first direction;

a valve arranged to regulate the flow of said vapor through said delivery line in said second direction;

a first pump coupled to said delivery line, said first pump arranged to draw vapor through said delivery line in said second direction;

a controller having a first input coupled to said first flow monitor, a first output coupled to said temperature control of said heating device, and a second output coupled to said valve, said controller arranged to control the supply of said vapor to said delivery line in said first direction based upon the measured flow of said vapor at said first input by varying said first output to adjust the temperature of said heating device and to bleed off excess amounts of said vapor in said first direction by varying said second output to adjust said valve.

37. A vapor delivery system for a solid precursor according to claim 36, further comprising a pressure sensor arranged to measure the pressure of said vapor within said delivery line in said first direction, wherein said controller has a second input coupled to said pressure sensor, said second input receiving as a second input signal the measured pressure of said vapor.

38. A vapor delivery system for a solid precursor according to claim 37, wherein said controller is arranged to vary said first output to adjust the temperature of said heating device based upon the measured pressure of said pressure sensor.

39. A vapor delivery system for a solid precursor according to claim 38, wherein said controller is arranged to compare said measured pressure against a guard band range of pressures, and said controller varies said first output to adjust the temperature of said heating device if said measured pressure is outside of said guard band range of pressures.

40. A vapor delivery system for a solid precursor according to claim 36, further comprising a temperature sensor arranged to measure the temperature of said vapor within said delivery line in said first direction, wherein said controller has a second input coupled to said temperature sensor, said second input receiving as a second input signal the measured temperature of said vapor.

41. A vapor delivery system for a solid precursor according to claim 36, further comprising a gas source coupled to an inlet in said vaporization chamber, wherein said gas source is arranged to supply a gas to said delivery line, said gas transferred to said delivery line to regulate the pressure within said delivery line.

42. A vapor delivery system for a solid precursor according to claim 41, wherein said controller further comprises a second output adapted to adjust the amount of said gas that is supplied to said delivery line by said gas source.

43. A vapor delivery system for a solid precursor according to claim 41, wherein said gas comprises an inert gas.

44. A vapor delivery system for a solid precursor according to claim 36, wherein said first valve comprises a digital valve.

45. A vapor delivery system for a solid precursor according to claim 36, wherein said first valve comprises a pulsed gate valve.

46. A vapor delivery system for a solid precursor according to claim 36, wherein said first valve is positioned upstream of said first flow monitor.

47. A vapor delivery system for a solid precursor comprising:

a vaporization chamber;

a first surface within said vaporization chamber, said first surface arranged to hold a solid precursor material;

a heating device having a temperature control, said temperature control arranged to vary the temperature of said heating device over a range of temperatures, at least a portion of the temperatures within said range of temperatures sufficient to transform said solid precursor material to a vapor, wherein said heating device is arranged to transfer heat to said first surface;

a delivery line coupled to said vaporization chamber, said delivery line arranged to route said vapor in a first direction and a second direction;

a flow monitor arranged to measure the flow of said vapor through said delivery line in said first direction;

a pressure sensor arranged to measure the pressure of said vapor within said delivery line in said first direction;

a valve arranged to regulate the flow of said vapor through said delivery line in said second direction;

a first pump coupled to said delivery line, said first pump arranged to draw vapor through said delivery line in said second direction;

a gas source coupled to an inlet in said vaporization chamber, said gas source arranged to supply an inert gas to said delivery line;

a flow regulator between said gas source and said inlet in said vaporization chamber; and, a controller having a first input coupled to said flow monitor, a second input coupled to said pressure sensor, a first output coupled to said temperature control of said heating device, a second output coupled to said valve, and a third output coupled to said flow regulator, said controller arranged to control the supply of said vapor to said delivery line in said first direction based upon the measured flow and pressure of said vapor at said first and second inputs by varying said first output to adjust the temperature of said heating device, to bleed off excess amounts of said vapor in said first direction by varying said second output to adjust said valve, and by varying said third output to adjust the amount of inert gas in said delivery line.

48. A vapor delivery system for a solid precursor comprising:

a vaporization chamber;

a first surface within said vaporization chamber, said first surface arranged to hold a solid precursor material;

a heating device having a temperature control, said temperature control arranged to vary the temperature of said heating device over a range of temperatures, at least a portion of the temperatures within said range of temperatures sufficient to transform said solid precursor material to a vapor, wherein said heating device is arranged to transfer heat to said first surface;

a delivery line coupled to said vaporization chamber, said delivery line arranged to route said vapor in a first direction and a second direction;

a flow monitor arranged to measure the flow of said vapor through said delivery line in said first direction;

a pressure sensor arranged to measure the pressure of said vapor within said delivery line in said first direction;

a temperature sensor arranged to measure the temperature of said vapor within said delivery line in said first direction;

a valve arranged to regulate the flow of said vapor through said delivery line in said second direction;

a first pump coupled to said delivery line, said first pump arranged to draw vapor through said delivery line in said second direction;

a gas source coupled to an inlet in said vaporization chamber, said gas source arranged to supply an inert gas to said delivery line;

a flow regulator between said gas source and said inlet in said vaporization chamber; and, a controller having a first input coupled to said flow monitor, a second input coupled to said pressure sensor, a third input coupled to said temperature sensor, a first output coupled to said temperature control of said heating device, a second output coupled to said valve, and a third output coupled to said flow regulator, said controller arranged to control the supply of said vapor to said delivery line in said first direction based upon the measured flow, pressure, and temperature of said vapor at said first, second, and third inputs by varying said first output to adjust the temperature of said heating device, to bleed off excess amounts of said vapor in said first direction by varying said second output to adjust said valve, and by varying said third output to adjust the amount of inert gas in said delivery line.

49. A feedback system for controlling the vapor flow of a solid precursor comprising:

a flow monitor arranged to measure the flow of vapor between a vaporization chamber and a deposition chamber;

a heating device arranged to apply a range of temperatures to said vaporization chamber to adjust the flow of vapor from said vaporization chamber; and, a controller arranged to adjust the temperature of said heating device to adjust the vapor flow measured by said flow monitor toward a predetermined vapor flow.

50. A feedback system for controlling the vapor flow of a solid precursor according to claim 49, further comprising a pressure sensor arranged to measure the pressure of the vapor between said vaporization chamber and said deposition chamber, wherein said controller is arranged to adjust the pressure of the vapor by adjusting the temperature of said heating device if the measured pressure is outside a guard band range of pressures.

51. A feedback system for controlling the vapor flow of a solid precursor comprising:

a flow monitor arranged to measure the flow of vapor between a vaporization chamber and a deposition chamber;

a valve positioned upstream of said flow monitor; and, a controller arranged to adjust said valve to bleed off portions of the flow of vapor to adjust the vapor flow measured by said flow monitor toward a predetermined vapor flow.

52. A feedback system for controlling the vapor flow of a solid precursor according to claim 51, further comprising a pressure sensor arranged to measure the pressure of the vapor between said vaporization chamber and said deposition chamber, wherein said controller is arranged to adjust the pressure of the vapor by adjusting said valve if the measured pressure is outside a guard band range of pressures.

53. A feedback system for controlling the vapor flow of a solid precursor comprising:

a flow monitor arranged to measure the flow of vapor between a vaporization chamber and a deposition chamber;

a heating device arranged to apply a range of temperatures to said vaporization chamber to adjust the flow of vapor from said vaporization chamber;

a valve positioned upstream of said flow monitor; and, a controller arranged to adjust the temperature of said heating device and adjust said valve to bleed off portions of said vapor flow from said flow monitor to adjust the vapor flow measured by said flow monitor toward a predetermined vapor flow.

54. A feedback system for controlling the vapor flow of a solid precursor according to claim 53, wherein said controller adjusts said valve if the vapor flow measured by said flow monitor is greater than said predetermined vapor flow, and said controller adjusts the temperature of said heating device within said range of temperatures if the vapor flow measured by said flow monitor is less than said predetermined vapor flow.

55. A feedback system for controlling the vapor flow of a solid precursor according to claim 53, wherein said controller adjusts said valve and the temperature of said heating device simultaneously if the vapor flow measured by said flow monitor is greater than said predetermined vapor flow, and said controller adjusts the temperature of said heating device if the vapor flow measured by said flow monitor is less than said predetermined vapor flow.

56. A feedback system for controlling the vapor flow of a solid precursor according to claim 53, wherein said controller adjusts said valve if the vapor flow measured by said flow monitor is greater than said predetermined vapor flow and a fine adjustment is required to adjust the vapor flow measured by said flow monitor toward said predetermined vapor flow, said controller adjusts the temperature of said heating device if the vapor flow measured by said flow monitor is greater than said predetermined vapor flow and a course adjustment is required to adjust the vapor flow measured by said flow monitor toward said predetermined vapor flow, and said controller adjusts the temperature of said heating device if the vapor flow measured by said flow monitor is less than said predetermined vapor flow.

57. A feedback system for controlling the vapor flow of a solid precursor according to claim 53, further comprising a pressure sensor arranged to measure the pressure of the vapor between said vaporization chamber and said deposition chamber, wherein said controller is arranged to adjust the pressure of the vapor by adjusting the temperature of the heating device if the measured pressure is outside a guard band range of pressures.

58. A feedback system for controlling the vapor flow of a solid precursor according to claim 53, further comprising a pressure sensor arranged to measure the pressure of the vapor between said vaporization chamber and said deposition chamber, wherein said controller is arranged to adjust the pressure of the vapor by adjusting said valve if the measured pressure is outside a guard band range of pressures.

* * * * *